(12) United States Patent
Braun et al.

(10) Patent No.: US 11,282,959 B2
(45) Date of Patent: Mar. 22, 2022

(54) FET DEVICE INSENSITIVE TO NOISE FROM DRIVE PATH

(71) Applicant: Monolithic Power Systems, Inc., San Jose, CA (US)

(72) Inventors: Eric Braun, Mountain View, CA (US); James Nguyen, San Jose, CA (US)

(73) Assignee: Monolithic Power Systems, Inc., San Jose, CA (US)

( * ) Notice: Subject to any disclaimer, the term of this patent is extended or adjusted under 35 U.S.C. 154(b) by 0 days.

(21) Appl. No.: 16/931,929

(22) Filed: Jul. 17, 2020

(65) Prior Publication Data
US 2022/0020878 A1 Jan. 20, 2022

(51) Int. Cl.
*H01L 29/78* (2006.01)
*H01L 29/10* (2006.01)
*H01L 29/08* (2006.01)

(52) U.S. Cl.
CPC ...... *H01L 29/7838* (2013.01); *H01L 29/0865* (2013.01); *H01L 29/0882* (2013.01); *H01L 29/1095* (2013.01); *H01L 29/7801* (2013.01); *H01L 29/781* (2013.01); *H01L 29/7809* (2013.01)

(58) Field of Classification Search
CPC ............ H01L 29/0865; H01L 29/0882; H01L 29/1095; H01L 29/7801; H01L 29/7809; H01L 29/781; H01L 29/7838
See application file for complete search history.

(56) References Cited

U.S. PATENT DOCUMENTS

| | | | | |
|---|---|---|---|---|
| 4,877,976 | A * | 10/1989 | Lach | H03K 19/09403 326/117 |
| 9,893,146 | B1 | 2/2018 | Eric | |
| 9,941,171 | B1 | 4/2018 | Ji-Hyoung | |
| 10,069,422 | B2 | 9/2018 | Huaifeng | |
| 10,083,930 | B2 | 9/2018 | Huaifeng | |
| 10,665,712 | B2 | 5/2020 | Eric | |
| 2009/0026544 | A1* | 1/2009 | Uno | H01L 24/40 257/365 |
| 2018/0286857 | A1 | 10/2018 | Huaifeng | |
| 2019/0088641 | A1* | 3/2019 | Braun | H01L 27/088 |
| 2019/0206857 | A1* | 7/2019 | Lin | H02H 9/046 |
| 2021/0143148 | A1* | 5/2021 | Jon | H03K 17/168 |

\* cited by examiner

*Primary Examiner* — Matthew E Warren
(74) *Attorney, Agent, or Firm* — Perkins Coie LLP

(57) ABSTRACT

A FET device has a substrate, a plurality of repetitive source stripes, a first layout of drain stripe having a first drift region and a first drain region, a second layout of drain stripe having a second drift region and a second drain region, a first drain contactor contacted with the first drain region and connected to a drain terminal, a second drain contactor contacted with the second drain region and connected to a first gate terminal, a source contactor contacted with a source region in each of the plurality of repetitive source stripes and connected to a source terminal, a first gate region positioned between the source region and the first drain region and connected to the first gate terminal, and a second gate region positioned between the source region and the second drain region and connected to a second gate terminal.

16 Claims, 5 Drawing Sheets

FET DEVICE INSENSITIVE TO NOISE FROM DRIVE PATH

TECHNICAL FIELD

The present invention relates to semiconductor device, and more particularly but not exclusively relates to Filed Effect Transistor (FET) device.

BACKGROUNDS

For switch mode power supplies, one or more discrete Field Effect Transistors (FETs) are employed with an independent gate driver. As shown in FIG. 1, a discrete FET 101 is coupled to a driver integrated circuit (IC) 102. The discrete FET 101 has a gate terminal Gate, a source terminal Source and a drain terminal Drain, the gate terminal Gate is coupled to the driver IC 102 to receive a voltage Vg, and the source terminal Source is coupled to the driver IC 102 to receive a voltage Vs.

However, parasitic parameters existing on a drive path (e.g., from Vg to the gate terminal Gate, and from Vs to the source terminal Source) could induce negative impact to switching operation of discrete FET 101. For example, a parasitic impedance 103, e.g., a parasitic resistance and/or a parasitic inductance, exists between the driver IC 102 and the gate terminal Gate of the discrete FET 101, and a parasitic impedance 104, e.g., a parasitic resistance and/or a parasitic inductance, exists between the driver IC 102 and the source terminal Source of the discrete FET 101. Parasitic impedances 103 and 104 could induce negative impact to the discrete FET 101, such as slow switching which resultant switching loss and low efficiency, and ringing to generate Electro-Magnetic Interference (EMI), overstress on the gate terminal Gate of the discrete FET 101, or potentially turn back on the discrete FET 101 after it is supposed to be turned off.

SUMMARY

It is one of the objects of the present invention to provide a FET device insensitive to noise from drive path and a method for forming the FET device.

One embodiment of the present invention discloses a FET device, having a drain terminal, a source terminal, a first gate terminal, and a second gate terminal, the FET device comprising: a substrate of a first conductivity type; a first layout of drain stripe, having a first drift region of a second conductivity type, and a first drain region of the second conductivity type; a second layout of drain stripe, having a second drift region of the second conductivity type, and a second drain region of the second conductivity type; a plurality of repetitive source stripes, each of the plurality of source stripes having a source region of a second conductivity type, and a body region of the first conductivity type, at least one of the plurality of repetitive source stripes is located between the first layout of drain stripe and the second layout of drain stripe; a first drain contactor, positioned above the substrate and contacted with the first drain region, the first drain contactor is connected to the drain terminal of the FET device; a second drain contactor, positioned above the substrate and contacted with the second drain region, the second drain contactor is connected to the first gate terminal of the FET device; a source contactor, positioned above the substrate and contacted with the source region and the body region, the source contactor is connected to the source terminal of the FET device; a first gate region, positioned above the substrate, and positioned between the source region and the first drain region, the first gate region is connected to the first gate terminal of the FET device; and a second gate region, positioned above the substrate, and positioned between the source region and the second drain region, the second gate region is connected to the second gate terminal of the FET device.

Another embodiment of the present invention discloses a FET device, comprising: a substrate of a first conductivity type; a first drain region of a second conductivity type; a first drain contactor, positioned above the substrate and contacted with the first drain region, the first drain contactor is connected to a drain terminal of the FET device; a second drain region of the second conductivity type; a second drain contactor, positioned above the substrate and contacted with the second drain region, the second drain contactor is connected to a first gate terminal of the FET device; a source region of the second conductivity type, the source region is between the first drain region and the second drain region; a source contactor, positioned above the substrate and contacted with the source region, the source contactor is connected to a source terminal of the FET device; a first gate region, positioned between the source region and the first drain region, and the first gate region is connected to the first gate terminal of the FET device; and a second gate region, positioned between the source region and the second drain region, and the second gate region is connected to a second gate terminal of the FET device.

Yet another embodiment of the present invention discloses a method for forming a FET device, comprising: forming a substrate; forming a body region, a first drift region and a second drift region in the substrate; forming a first drain region in the first drift region, forming a second drain region in the second drift region, and forming a source region in the body region; forming a source contactor positioned above the substrate and contacted with the source region, forming a first drain contactor above the substrate and contacted with the first drain region, and forming a second drain contactor above substrate and contacted with the second drain region; forming a first gate region between the first drain region and the source region, and forming a second gate region between the second drain region and the source region; and forming a drain terminal connected to the first drain contactor, forming a source terminal connected to the source contactor, forming a first gate terminal connected to the first gate region and the second drain contactor, and forming a second gate terminal connected to the second gate region.

BRIEF DESCRIPTION OF THE DRAWINGS

The present invention can be further understood with reference to the following detailed description and the appended drawings, wherein like elements are provided with like reference numerals. The drawings are only for illustration purpose, thus may only show part of the devices and are not necessarily drawn to scale.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

The terms "left," right," "in," "out," "front," "back," "up," "down, "top," "atop," "bottom," "over," "under," "beneath," "above," "below" and the like in the description and the claims, if any, are used for descriptive purposes and not necessarily for describing permanent relative positions. It is to be understood that the terms so used are interchangeable under appropriate circumstances such that embodiments of the technology described herein are, for example, capable of operation in other orientations than those illustrated or otherwise described herein.

To mitigate negative impact caused by gate path noise of a discrete FET, a FET device according to embodiments of the present invention integrates a power FET and a pull down FET on a same die using a same mask set and process steps.

Figure 1:
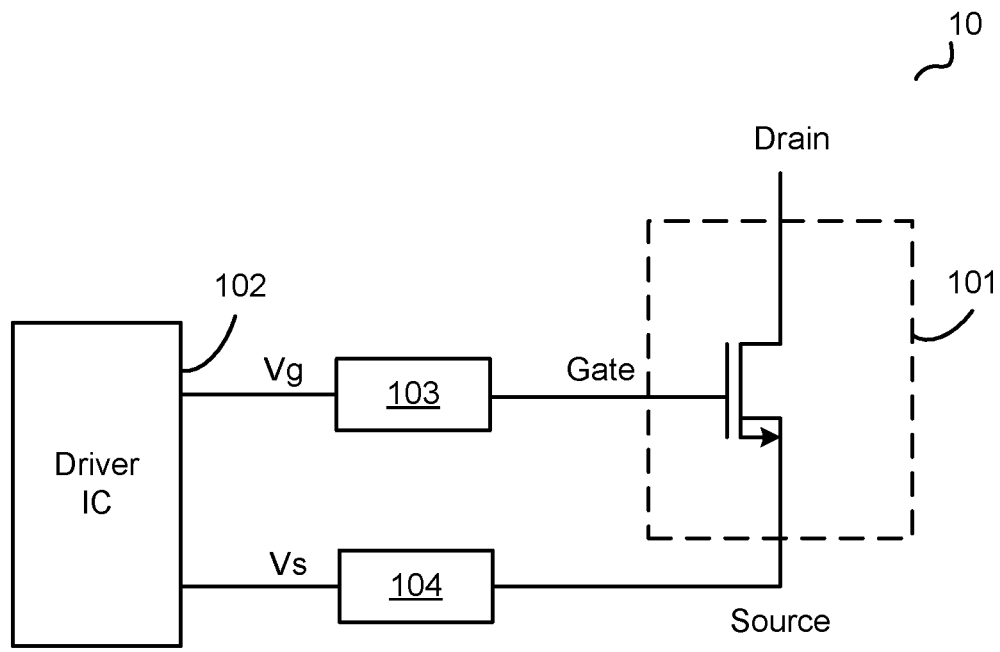
FIG. 1 shows a prior art discrete FET 10 with an independent gate driver.
Figure 2:
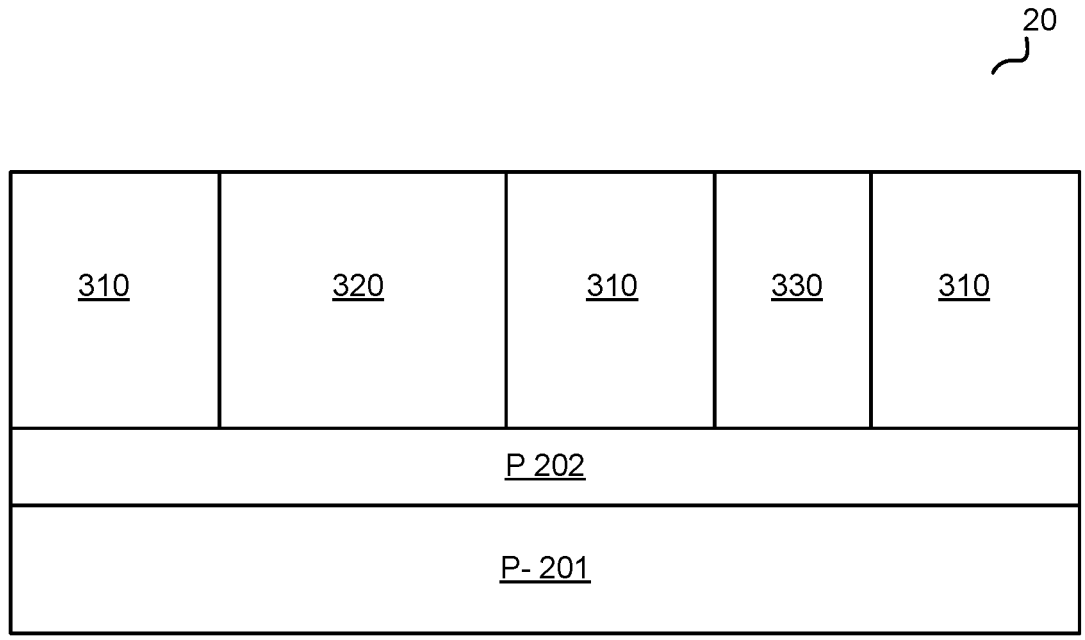
FIGS. 2-3 illustrate a sectional view of a FET device 20 according to an embodiment of the present invention.
Figure 3:
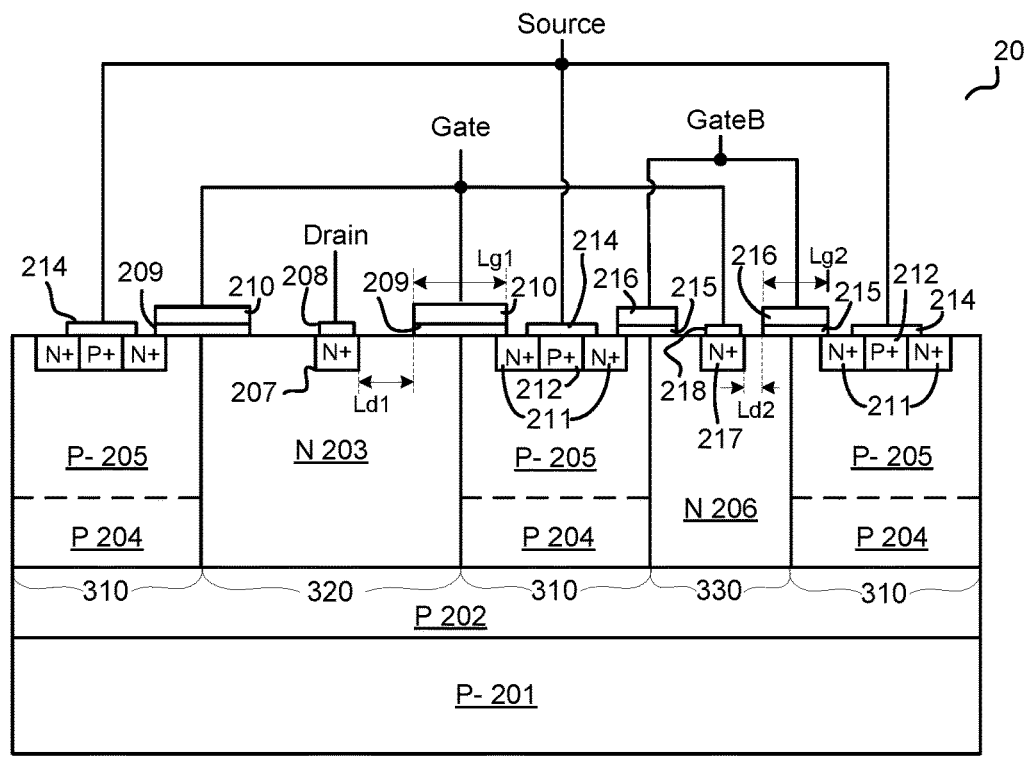

FIGS. 2-3 illustrate a sectional view of a FET device 20 according to an embodiment of the present invention.

The FET device 20 is formed in a substrate 201 of a first conductivity type (e.g., "P−" as shown in FIG. 2). The FET device 20 is usually laid out in stripes, with source and drain stripes alternating. Usually, a traditional FET device comprises repetitive drain stripes of a same construction. However, as one example shown in FIG. 2, the FET device 20 comprises a first layout of drain stripe 320, a second layout of drain stripe 330, and a plurality of repetitive source stripes 310. The drain stripe 320 and the drain stripe 330 have different layout size. at least one of the source stripes 310 is located between the first layout of drain stripe 320 and the second layout of drain stripe 330. In one embodiment, a layout size of the drain stripe 330 is smaller than a layout size of the drain stripe 320. In one embodiment, a power FET is formed by the drain stripe 320 and the source stripe 310, while a pull down FET is formed by the drain stripe 330 and the source stripe 310. In one embodiment, a buried layer 202 of the first conductivity type (e.g., "P" as shown in FIG. 2) is formed in the substrate 201 to isolate drain stripes 320 and 330.

As shown in FIG. 3, each source stripe 310 comprises a source region 211 having a second conductivity type opposite to the first conductive type (e.g., "N+") and a body region having the first conductivity type. In one embodiment, the body region comprises a first region 212 (e.g., "P+"), a second region 205 (e.g., "P−"), and a third region 204 (e.g., "P"). In one embodiment, the source region 211 has a first portion and a second portion respectively distributed on both sides of the body region, e.g., the first region 212 is in the middle, and the first portion and the second portion of the source region 211 are disposed on both sides of the first region 212. The drain stripe 320 comprises a drift region 203 of the second conductivity type (e.g., "N") and a drain region 207 of the second conductivity type (e.g., "N+") formed in the drift region 203. The drain stripe 330 comprises a drift region 206 of the second conductivity type (e.g., "N"), and a drain region 217 of the second conductivity type (e.g., "N+") formed in the drift region 206. In one embodiment, the drift region 203 is wider than the drift region 206.

The FET device 20 further comprises a first gate region which comprises a gate oxide 209 and a gate polysilicon 210. The first gate region is laterally positioned between the drain region 207 and the source region 211 so as to establish a channel under the first gate region. In one embodiment, the gate oxide 209 touches the source region 211. In one embodiment, the gate oxide 209 is positioned above a portion of the drift region 203, a portion of the body region and a portion of the source region 211, and the gate polysilicon 210 is positioned above the gate oxide 209. The FET device 20 further comprises a second gate region which comprises a gate oxide 215 and a gate polysilicon 216. The second gate region is laterally positioned between the drain region 217 and the source region 211 so as to establish a channel under the second gate region. In one embodiment, the gate oxide 215 touches the source region 211. In one embodiment, the gate oxide 215 is positioned above a portion of the drift region 206, a portion of the body region and a portion of the source region 211, and the gate polysilicon 216 is positioned above the gate oxide 215.

In one embodiment, the gate polysilicon 210 is coupled to a gate terminal Gate, and the gate polysilicon 216 is coupled to a gate terminal GateB. A drain contactor 208 disposed above the drain region 207 is coupled to a drain terminal Drain. A source contactor 214 disposed above the first region 212 and the source region 211 is coupled to a source terminal Source. A drain contactor 218 disposed above the drain region 217 is coupled to the gate terminal Gate. In one embodiment, the drain contactor 208, the drain contactor 218, and the source contactor 214 comprise silicide.

Figure 4:
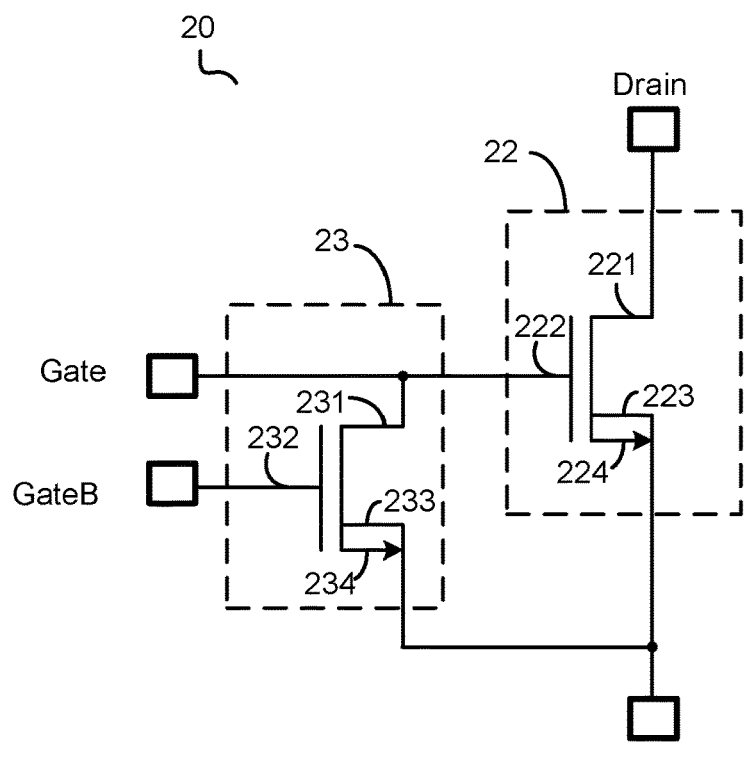
FIG. 4 illustrate a circuit block diagram of the FET device 20 according to an embodiment of the present invention.

FIG. 4 illustrate a circuit block diagram of the FET device 20 according to an embodiment of the present invention. As shown in FIG. 4, the FET device 20 comprises a power FET 22 and a pull down FET 23. The power FET 22 comprises a drain 221 coupled to the drain terminal Drain, a gate 222 coupled to the gate terminal Gate, a source 223 and a body 224 coupled to the source terminal Source. The pull down FET 23 comprises a drain 231 coupled to the gate terminal Gate, a gate 232 coupled to the gate terminal GateB, a source 233 and a body 234 coupled to the source terminal Source.

In one embodiment, the pull down FET 23 has identical device structure as the power FET 22, excepting that the pull down FET 23 has smaller device layout. In one embodiment, as shown in FIG. 2, a lateral width Lg2 of the second gate region is less than a lateral width Lg1 of the first gate region, and/or, a space Ld2 from edge of the drain region 217 to edge of the gate oxide 215 is less than a space Ld1 from edge of the drain region 207 to edge of the gate oxide 209.

In one embodiment, the power FET 22 comprises a plurality of power FET cells, each of the power FET cells is formed by the drain region 207, the source region 211, the body region, the gate oxide 209, and the gate polysilicon 210. While the pull down FET 23 comprises a plurality of pull down FET cells, each of the pull down FET cells is formed by the drain region 217, the source region 211, the body region, the drain contactor 218, the source contactor 214, the gate oxide 215, and the gate polysilicon 216. The power FET cells and the pull down FET cells share the same substrate and the same source stripes.

The FET device 20 proposed by embodiments of the present invention requires no extra mask with relatively small impact on total die size after integrating the pull down FET 23 with the power FET 22, since the pull down FET 23 is typically several orders of magnitude smaller conductance and area than the power FET 22.

Figure 5:
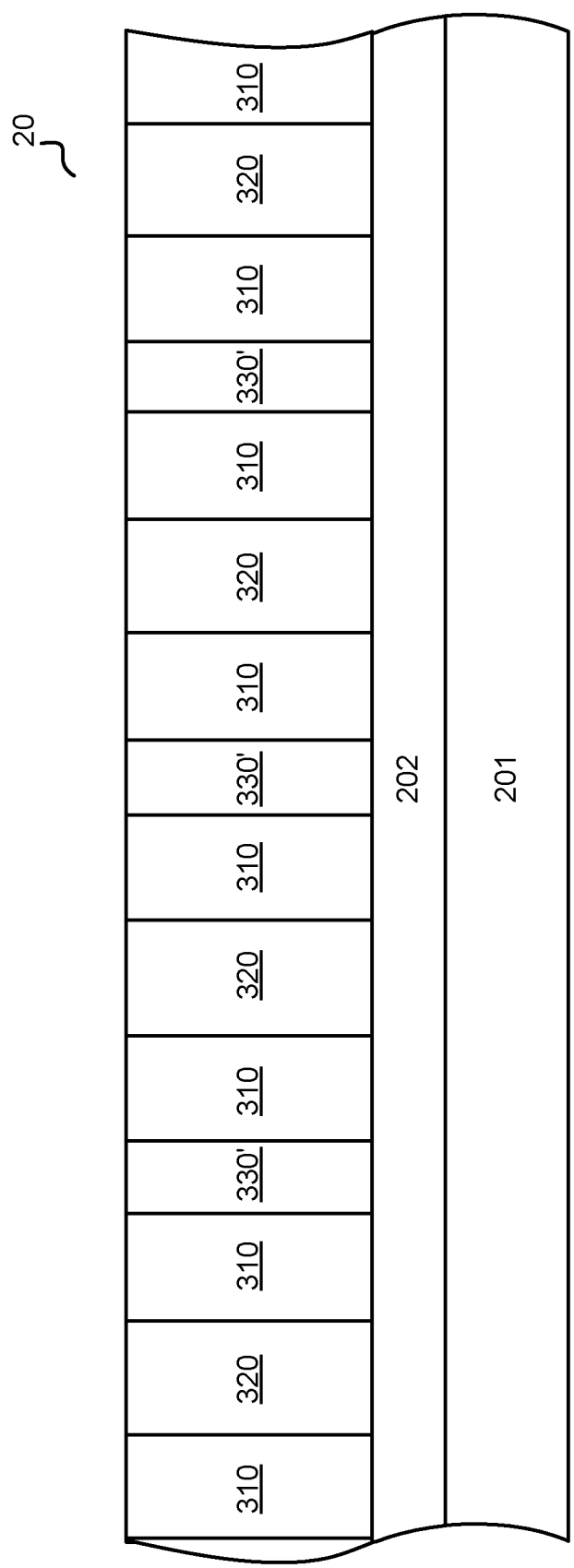
FIGS. 5-6 illustrate a sectional view of the FET device 20 according to other embodiments of the present invention.
Figure 6:
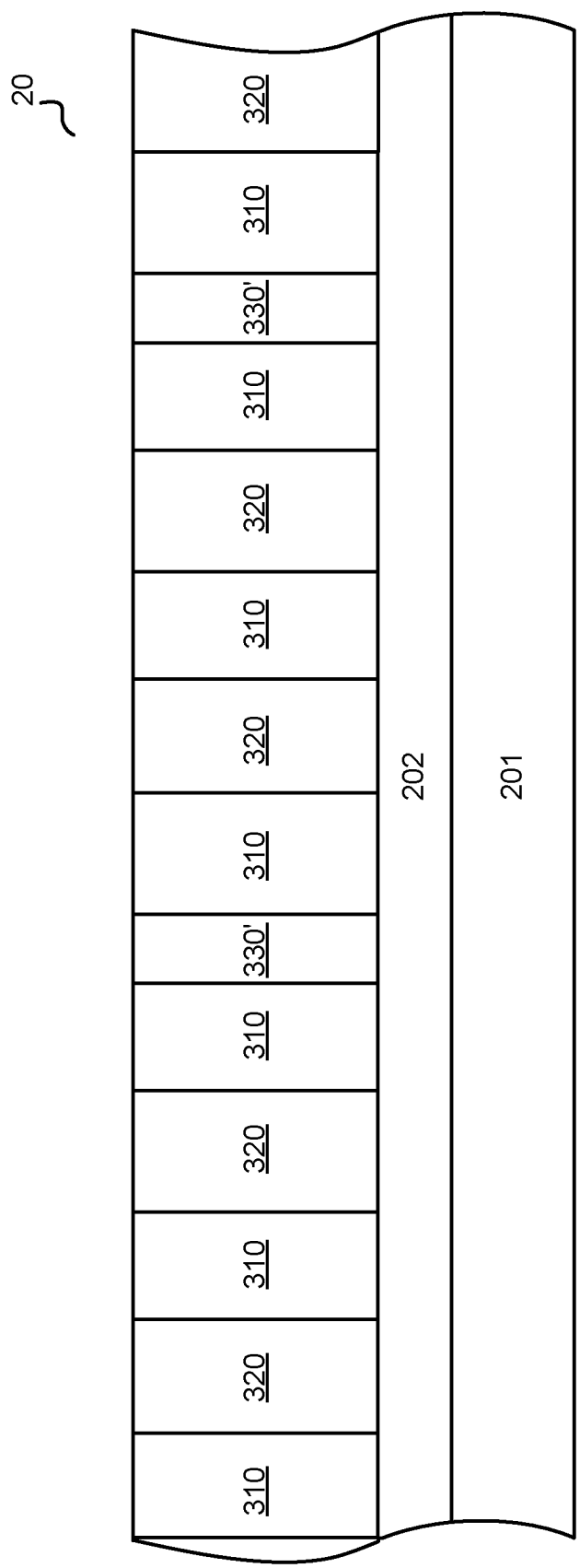

FIGS. 5-6 illustrate a sectional view of the FET device 20 according to other embodiments of the present invention. As shown in FIGS. 5-6, the pull down FET 23 is distributed into many small pieces, i.e., many small cells, e.g., distributed into many small drain stripes 330'. Each cell of the pull down FET 23 protects a local section of the power FET 22, to reduce internal parasitic impedance between the pull down FET 23 and the power FET 22 to get faster response time and batter ESD/EOS protection. Thus the FET device 20 could have significant gate and/or source voltage deviation during fast switching and ringing.

Figure 7:
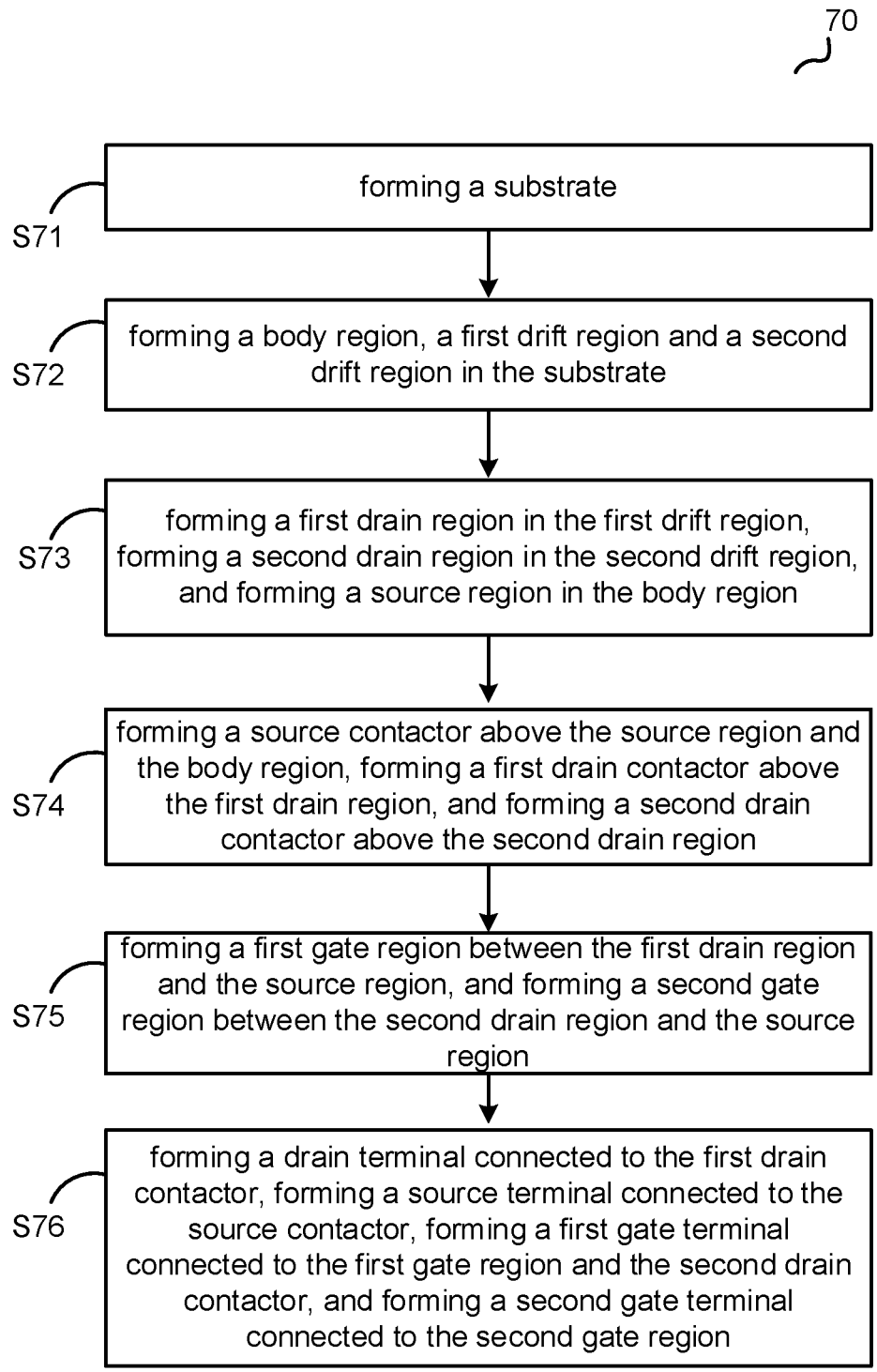
FIG. 7 illustrate a method 70 for forming a FET device according to an embodiment of the present invention.

FIG. 7 illustrate a method 70 for forming a FET device according to an embodiment of the present invention. Method 70 comprises steps S71-S76.

At step S71, forming a substrate. In one embodiment, a buried layer is formed in the substrate.

At step S72, forming a body region, a first drift region and a second drift region in the substrate.

At step S73, forming a first drain region in the first drift region, forming a second drain region in the second drift region, and forming a source region in the body region.

At step S74, forming a source contactor above the substrate and contacted with the source region and the body region, forming a first drain contactor above the substrate and contacted with the first drain region, and forming a second drain contactor above the substrate and contacted with the second drain region.

At step S75, forming a first gate region between the first drain region and the source region, and forming a second gate region between the second drain region and the source region. In one embodiment, a lateral width of the first gate region is larger than a lateral width of the second gate region. In one embodiment, a space from an edge of the first drain region to an edge of the first gate region is larger than a space from an edge of the second drain region to an edge of the second gate region. In one embodiment, the first gate region comprises a first gate oxide and a first gate polysilicon, and the first gate oxide touches the source region. In one embodiment, the second gate region comprises a second gate oxide and a second gate polysilicon, and the second gate oxide touches the source region.

At step S76, forming a drain terminal connected to the first drain contactor, forming a source terminal connected to the source contactor, forming a first gate terminal connected to the first gate region and the second drain contactor, and forming a second gate terminal connected to the second gate region.

Note that in the method described above, the box functions may also be implemented with different order as shown in FIG. 7. For example, two successive box functions may be executed meanwhile, or sometimes the box functions may be executed in reverse order.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

We claim:

1. A FET device, having a drain terminal, a source terminal, a first gate terminal, and a second gate terminal, the FET device comprising:
a substrate of a first conductivity type;
a first layout of drain stripe, having a first drift region of a second conductivity type, and a first drain region of the second conductivity type;
a second layout of drain stripe, having a second drift region of the second conductivity type, and a second drain region of the second conductivity type;
a plurality of repetitive source stripes, each of the plurality of repetitive source stripes having a source region of the second conductivity type, and a body region of the first conductivity type, at least one of the plurality of repetitive source stripes is located between the first layout of drain stripe and the second layout of drain stripe;
a first drain contactor, positioned above the substrate and contacted with the first drain region, the first drain contactor is connected to the drain terminal of the FET device;
a second drain contactor, positioned above the substrate and contacted with the second drain region, the second drain contactor is connected to the first gate terminal of the FET device;
a source contactor, positioned above the substrate and contacted with the source region and the body region, the source contactor is connected to the source terminal of the FET device;
a first gate region, positioned above the substrate, and positioned between the source region and the first drain region, the first gate region is connected to the first gate terminal of the FET device; and
a second gate region, positioned above the substrate, and positioned between the source region and the second drain region, the second gate region is connected to the second gate terminal of the FET device.

2. The FET device of claim 1, wherein a layout size of the second layout of drain stripe is smaller than a layout size of the first layout of drain stripe.

3. The FET device of claim 1, wherein a lateral width of the first gate region is larger than a lateral width of the second gate region.

4. The FET device of claim 1, wherein a space from an edge of the first drain region to an edge of the first gate region is larger than a space from an edge of the second drain region to an edge of the second gate region.

5. The FET device of claim 1, further comprising a plurality of power FET cells and a plurality of pull down FET cells, each of the plurality of power FET cells is formed by the first drain region, the source region, the body region, and the first gate region, and each of the plurality of pull down FET cells is formed by the second drain region, the source region, the body region, and the second gate region.

6. The FET device of claim 1, further comprising a buried layer of the first conductivity type formed in the substrate, wherein the first layout of drain stripe, the second layout of drain stripe, and the plurality of repetitive source stripes are positioned above the buried layer.

7. The FET device of claim 1, wherein the first gate region comprises a first gate oxide and a first gate polysilicon, and the second gate region comprises a second gate oxide and a second gate polysilicon.

8. The FET device of claim 7, wherein the source region further comprises a first portion and a second portion respectively distributed on both sides of the body region, the first gate oxide is configured to touch the first portion of the source region and the second gate oxide is configured to touch the second portion of the source region.

9. A FET device, comprising:
a substrate of a first conductivity type;
a first drain region of a second conductivity type;
a first drain contactor, positioned above the substrate and contacted with the first drain region, the first drain contactor is connected to a drain terminal of the FET device;
a second drain region of the second conductivity type;
a second drain contactor, positioned above the substrate and contacted with the second drain region, the second drain contactor is connected to a first gate terminal of the FET device;
a source region of the second conductivity type, the source region is between the first drain region and the second drain region, the source region contacts a first gate region and a second gate region;
a source contactor, positioned above the substrate and contacted with the source region, the source contactor is connected to a source terminal of the FET device;
the first gate region, positioned between the source region and the first drain region, and the first gate region is connected to the first gate terminal of the FET device; and
the second gate region, positioned between the source region and the second drain region, and the second gate region is connected to a second gate terminal of the FET device.

10. The FET device of claim 9, wherein a lateral width of the first gate region is larger than a lateral width of the second gate region.

11. The FET device of claim 9, wherein a space from an edge of the first drain region to an edge of the first gate region is larger than a space from an edge of the second drain region to an edge of the second gate region.

12. The FET device of claim 9, wherein the first gate region comprises a first gate oxide and a first gate polysilicon, and the second gate region comprises a second gate oxide and a second gate polysilicon.

13. The FET device of claim 12, wherein the source region comprises a first portion and a second portion respectively distributed on both sides of a body region, wherein the first gate oxide is configured to touch the first portion of the source region and the second gate oxide is configured to touch the second portion of the source region.

14. The FET device of claim 9, wherein a power FET cell is formed by the first drain region, the source region and the first gate region, and a pull down FET cell is formed by the second drain region, the source region, and the second gate region.

15. The FET device of claim 14, wherein a layout size of the pull down FET cell is smaller than a layout size of the power FET cell.

16. The FET device of claim 14, further comprising a plurality of repetitive power FET cells, and a plurality of repetitive pull down FET cells, wherein a quantity of the plurality of repetitive power FET cells is more than a quantity of the plurality of repetitive pull down FET cells.

* * * * *